(12) United States Patent
Kim et al.

(10) Patent No.: US 8,581,230 B2
(45) Date of Patent: Nov. 12, 2013

(54) LIGHT-EMITTING DEVICE HAVING ENHANCED LUMINESCENCE BY USING SURFACE PLASMON RESONANCE AND METHOD OF FABRICATING THE SAME

(75) Inventors: Tae-ho Kim, Suwon-si (KR);
Chang-won Lee, Seoul (KR);
Byoung-lyong Choi, Seoul (KR);
Kyung-sang Cho, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 41 days.

(21) Appl. No.: 12/977,195

(22) Filed: Dec. 23, 2010

(65) Prior Publication Data

US 2012/0032138 A1 Feb. 9, 2012

(30) Foreign Application Priority Data

Aug. 6, 2010 (KR) .................. 10-2010-0075983

(51) Int. Cl.
*H01L 33/04* (2010.01)
(52) U.S. Cl.
USPC .............................................. 257/13; 257/48

(58) Field of Classification Search
USPC ...................................... 257/13, E33.008, 48
See application file for complete search history.

(56) References Cited

U.S. PATENT DOCUMENTS

| 2005/0116633 A1* | 6/2005 | Yamazaki et al. ............ 313/506 |
| 2008/0227230 A1* | 9/2008 | Lee et al. ........................ 438/29 |
| 2011/0187264 A1* | 8/2011 | Yasuda et al. ................. 313/504 |

FOREIGN PATENT DOCUMENTS

| JP | 2007-035430 A | 2/2007 |
| KR | 1020070053144 A | 5/2007 |
| KR | 1020080068241 A | 7/2008 |
| KR | 1020080068244 A | 7/2008 |
| KR | 1020080069085 A | 7/2008 |
| KR | 1020090108237 A | 10/2009 |

* cited by examiner

*Primary Examiner* — Tran Tran
(74) *Attorney, Agent, or Firm* — Cantor Colburn LLP

(57) ABSTRACT

A quantum dot light-emitting device includes a substrate, a first electrode, a hole injection layer ("HIL"), a hole transport layer ("HTL"), an emitting layer, an electron transport layer ("ETL"), a plurality of nanoplasmonic particles buried in the ETL, and a second electrode.

12 Claims, 10 Drawing Sheets

LIGHT-EMITTING DEVICE HAVING ENHANCED LUMINESCENCE BY USING SURFACE PLASMON RESONANCE AND METHOD OF FABRICATING THE SAME

CROSS-REFERENCE TO RELATED APPLICATIONS

This application claims priority to Korean Patent Application No. 10-2010-0075983, filed on Aug. 6, 2010, and all the benefits accruing therefrom under §119, the disclosure of which is incorporated herein in its entirety by reference.

BACKGROUND

1. Field

Provided is a quantum dot ("QD") light-emitting device or an organic light-emitting device ("OLED"), and method of fabricating the same, and more particularly, to a QD light-emitting device or an OLED having enhanced luminescence by using surface plasmon resonance and method of fabricating the same.

2. Description of the Related Art

An organic light-emitting device ("OLED") uses a thin film formed of an organic material as an emitting layer. The OLED may be formed of various types of materials, such as a high-purity thin film. However, a lifetime of an organic light-emitting material of the OLED is relatively short, and a complicated and expensive film forming process is necessary.

Recently, research into a light-emitting device using quantum dot ("QD") luminescence has been actively conducted. A QD is a semiconductor material that has a several-nanometer crystalline structure, each QD being smaller than a diameter of Bohr excitons. Although a large quantity of electrons exist in the QD, the number of free electrons from among the electrons is limited to between about 1 and about 100. As a result thereof, energy levels of the electrons in the QD are discontinuous. Thus, the QD has electric and optical characteristics that are different from those of a semiconductor in a bulk state which form a continuous band.

For example, since an energy level of the QD varies according to a size of the QD, it is possible to adjust a bandgap by simply changing the size of the QD. That is, an emitting wavelength of the QD may be adjusted by simply changing the size of the QD. This means that emitting of colors may be easily adjusted by changing the size of the QD. The QD has self-luminescence, ease in adjusting colors, and high color purity, and also a solution forming process is possible with respect to the QD. Thus, a QD light-emitting device may be used in a large next generation display having high display quality. However, in spite of the aforementioned merits, efficiency and brightness of the QD light-emitting device are not sufficient to be applied to a display.

SUMMARY

Provided is an organic light-emitting device ("OLED") having enhanced luminescence by using surface plasmon resonance.

Provided are methods of fabricating the OLED.

Additional aspects will be set forth in part in the description which follows and, in part, will be apparent from the description, or may be learned by practice of the presented embodiments.

Provided is a light-emitting device includes a substrate, a first electrode arranged on the substrate, an emitting layer arranged on the first electrode and including an organic light-emitting material or a plurality of quantum dots ("QDs"), an electron transport layer ("ETL") arranged on the emitting layer, a plurality of nanoplasmonic particles dispersed and buried in the ETL, and a second electrode arranged on the ETL.

In an embodiment, the light-emitting device may further include a hole injection layer ("HIL") that is interposed between the first electrode and the emitting layer and is arranged on the first electrode, and a hole transport layer ("HTL") that is disposed between the HIL and the emitting layer.

In an embodiment, the plurality of nanoplasmonic particles may be configured to cause surface plasmon resonance due to light emitted from the emitting layer.

In an embodiment, a distance between the plurality of nanoplasmonic particles and the emitting layer may be within an effective distance of an electromagnetic wave that is generated by the surface plasmon resonance.

In an embodiment, the distance between the plurality of nanoplasmonic particles and the emitting layer may be between about 10 nanometers (nm) and about 12 nanometers (nm).

In an embodiment, the plurality of nanoplasmonic particles may be in a nano-disc shape.

In an embodiment, each of the plurality of nanoplasmonic particles may have a thickness between about 5 nm and about 50 nm, and each of the plurality of nanoplasmonic particles may have a diameter between about 10 nm and about 100 nm.

In an embodiment, an average distance between each of the plurality of nanoplasmonic particles may be greater than 0 nm and less than 10 nm.

In an embodiment, a size of each of the plurality of nanoplasmonic particles may be uniform within ±15% of an average size.

In an embodiment, the plurality of nanoplasmonic particles may be formed of a metal material selected from the group consisting of Ag, Au, Cu, Pb, In, Hg, Sn, Cd, and combinations thereof.

In an embodiment, the ETL may include an inorganic oxide semiconductor material or an organic material. In one embodiment, for example, the ETL may include titanium oxide ("TiOx") or ionomer resin.

In an embodiment, the ETL may have a thickness between about 40 nm and about 60 nm.

In an embodiment, the substrate may be a transparent substrate, the first electrode may be a transparent electrode, and the second electrode may be a reflective electrode.

In an embodiment, the plurality of nanoplasmonic particles may be arrayed according to a lattice-structure pattern.

In an embodiment, the light emitting device may further include red, green and blue pixels, and the emitting layer, the plurality of nanoplasmonic particles, and the second electrode may be patterned according to the red, green, and blue pixels.

Provided is a method of fabricating a light-emitting device, the method including sequentially forming a first electrode, an emitting layer including an organic light-emitting material or a plurality of QDs, and a first ETL portion on a substrate, forming a plurality of metal nanodots on a source substrate, separating the plurality of metal nanodots from the source substrate by using an elastomer stamp, and transferring the plurality of metal nanodots onto a surface of the first ETL portion, transforming the plurality of metal nanodots on the first ETL portion into a plurality of nanoplasmonic particles by performing a thermal annealing operation, forming a second ETL portion on the first ETL portion and the plurality of nanoplasmonic particles so as to form an ETL in which the plurality of nanoplasmonic particles are buried, and forming a second electrode on the ETL.

In an embodiment, the method may further include forming a HIL and a HTL on the first electrode before the emitting layer is formed on the first electrode.

In an embodiment, the plurality of metal nanodots may be surface-treated with a self-assembled monolayer ("SAM").

In an embodiment, the SAM may include alkanethiol.

In an embodiment, the thermal annealing operation may be performed in a nitrogen atmosphere for about 30 minutes to about 40 minutes at a temperature between about 150 degrees Celsius (° C.) and about 250 degrees Celsius (° C.).

In an embodiment, the first ETL portion may have a thickness between about 10 nm and about 12 nm, and a distance between the plurality of nanoplasmonic particles and the emitting layer is between about 10 nm and about 12 nm.

In an embodiment, the second ETL portion may have a thickness between about 30 nm and about 50 nm.

In an embodiment, the first and second ETL portions may be formed of TiOx or ionomer resin.

In an embodiment, a bottom surface of the elastomer stamp may have a lattice-structure pattern, whereby the plurality of nanoplasmonic particles to be formed on the first ETL portion may be arrayed according to a lattice-structure pattern.

Provided is another method of fabricating a light-emitting device, including sequentially forming a first electrode, an emitting layer including an organic light-emitting material or a plurality of QDs, and a first ETL portion on a substrate, forming a plurality of metal nanodots on a source substrate, transforming the plurality of metal nanodots on the source substrate into a plurality of nanoplasmonic particles by performing a thermal annealing operation, separating the plurality of nanoplasmonic particles from the source substrate by using an elastomer stamp, and transferring the plurality of nanoplasmonic particles onto a surface of the first ETL portion, forming a second ETL portion on the first ETL portion and the plurality of nanoplasmonic particles so as to form an ETL in which the plurality of nanoplasmonic particles are buried, and forming a second electrode on the ETL.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
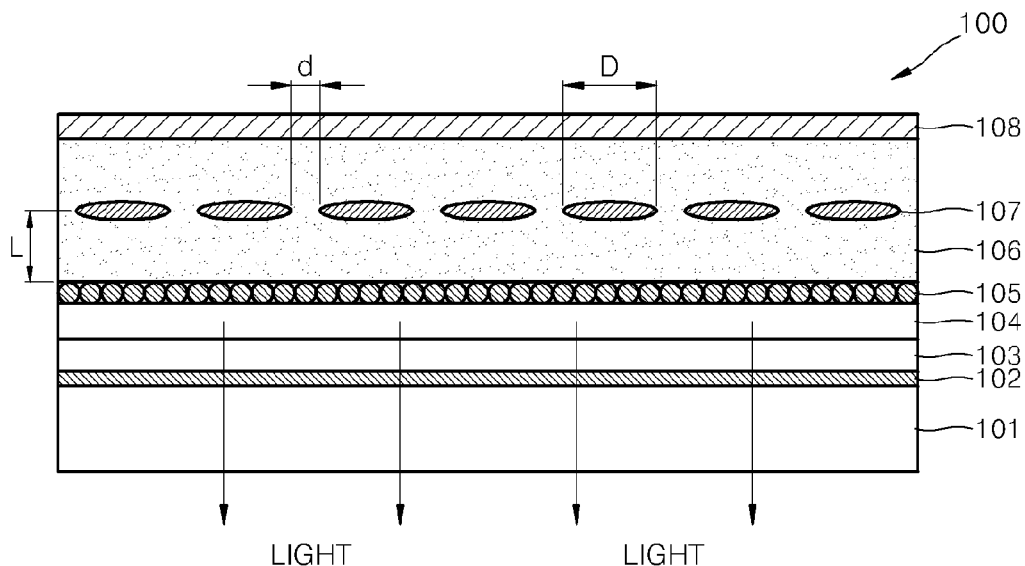
FIG. 1 is a cross-sectional view for illustrating an embodiment of a structure of a light-emitting device, according to the present invention.

Reference will now be made in detail to embodiments, examples of which are illustrated in the accompanying drawings, wherein like reference numerals refer to like elements throughout and the size of each component may be exaggerated for clarity. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a cross-sectional view for illustrating an embodiment of a structure of a light-emitting device 100, according to the present invention. Referring to FIG. 1, the light-emitting device 100 according to the present embodiment may include a substrate 101, a first electrode 102 arranged on the substrate 101, a hole injection layer ("HIL") 103 arranged on the first electrode 102, a hole transport layer ("HTL") 104 arranged on the HIL 103, an emitting layer 105 arranged on the HTL 104, an electron transport layer ("ETL") 106 arranged on the emitting layer 105, a plurality of a nanoplasmonic particle 107 dispersed and buried in the ETL 106, and a second electrode 108 arranged on the ETL 106, in order. Although not illustrated in FIG. 1, an electron injection layer ("EIL") may be further arranged between the ETL 106 and the second electrode 108. Also, the HIL 103 and the HTL 104 between the first electrode 102 and the emitting layer 105 are optional, and thus may be omitted in alternative embodiments. In this case, the emitting layer 105 may be directly arranged on the first electrode 102.

The substrate 101 may be a transparent substrate including a transparent material including glass. However, the substrate 101 may include a transparent plastic material other than glass.

The first electrode 102 arranged on the substrate 101 may be a transparent electrode. The first electrode 102 may be an anode, and may include a transparent conductive oxide ("TCO") having a relatively high work function so as to provide holes. In one embodiment, for example, the first electrode 102 may include indium tin oxide ("ITO") or indium zinc oxide ("IZO").

The HIL 103 functions to lower a driving voltage of the light-emitting device 100 by increasing hole injection efficiency. The HIL 103 may include polystyrene sulfonic acid ("PSS")-doped poly(3,4-ethylenedioxythiophene) ("PEDOT:PSS"), or copper phthalocyanine (CuPc).

The HTL 104 functions to deliver the holes, which are injected from the HIL 103, to the emitting layer 105. The HTL 104 includes a material having suitable ionization potential and hole mobility. In one embodiment, for example, the HTL 104 may include triphenyl-diamine ("TPD") or poly-vinylcarbazole ("PVK").

In a case where the light-emitting device 100 is a quantum dot ("QD") light-emitting device, the emitting layer 105 may have a plurality of QDs. The QD is a particle having a predetermined size and a quantum confinement effect. The QD may include a compound semiconductor including CdTe, CdSe, ZnS, CdS, or the like. In one embodiment, for example, the QD may have a diameter between about 1 nanometer (nm) and about 10 nanometers (nm) according to an emitting wavelength.

Each of the QDs may have a uniform single structure, or a core-shell structure. Various core-shell structures, e.g., the QDs having a structure of CdSe/AsS, CdTe/CdSe, CdSe/ZnS, or the like may be used. Here, an energy bandgap of a shell material may be greater than an energy bandgap of a core material.

The light-emitting device 100 may be an organic light-emitting device ("OLED"). In this case, the emitting layer 105 may include a general organic light emission material. With respect to the organic light emission material, various compounds are developed according to emission colors. Hereinafter, for convenience of description, a case in which the emitting layer 105 includes the plurality of QDs will be described.

The ETL 106 arranged directly on the emitting layer 105 functions to deliver electrons, which are received from the second electrode 108, to the emitting layer 105. The ETL 106 may include an inorganic oxide semiconductor material or an organic material, which has a relatively high electron mobility. In one embodiment, for example, the ETL 106 may include titanium oxide ("TiOx") as the inorganic oxide semiconductor material, or may include ionomer resin as the organic material. Since TiOx or ionomer resin has a high electron mobility, TiOx or ionomer resin may have a relatively large thickness.

When a metal is disposed in the vicinity of the emitting layer 105, the metal may impede or prevent excitons from moving to a ground state, where the excitons are generated in such a manner that electrons and holes are recombined in the emitting layer 105. Due to this prevention of excitons moving to a ground state, luminescence efficiency of the emitting layer 105 deteriorates such that a brightness of the light-emitting device 100 may deteriorate. The deterioration of the brightness of the light-emitting device 100, such as by the prevention of the excitons moving to a ground state, is referred to 'luminescence quenching'.

In a case where TiOx or ionomer resin is used, the ETL 106 may have a relatively large thickness between about 40 nm and about 60 nm, so that the ETL 106 may have the nanoplasmonic particles 107 buried therein, and luminescence quenching due to the nanoplasmonic particles 107 buried therein or the second electrode 108 arranged thereon may be reduced or effectively prevented. As illustrated in FIG. 1, a portion of the ETL 106 is between the nanoplasmonic particles 107 and adjacent layers, e.g., the second electrode 108 and the emitting layer 105, such that the nanoplasmonic particles 107 "buried" in the ETL 106. Further, since the nanoplasmonic particles 107 are not substantially near an adjacent layer, the nanoplasmonic particles 107 are further "buried" in the ETL 106.

The nanoplasmonic particles 107 buried in the ETL 106 function to cause surface plasmon resonance, which will be described later. The nanoplasmonic particles 107 may have a size or dimension that is sufficiently thin and small so as to cause the surface plasmon resonance. In one embodiment, for example, each of the nanoplasmonic particles 107 may have a thickness between about 5 nm and about 50 nm, or between about 10 nm and about 15 nm. Referring to FIG. 1, the thickness is taken perpendicular to the substrate 101. Also, an approximate diameter D of each of the nanoplasmonic particles 107 may be between about 10 nm and about 100 nm, or between about 40 nm and about 60 nm. Thus, the nanoplasmonic particles 107 may have a thin nano-disc shape.

The size of the nanoplasmonic particles 107 may be appropriately selected within the aforementioned range according to a design. According to the present embodiment, most of the nanoplasmonic particles 107 that are buried in the ETL 106 may have a uniform size. In one embodiment, for example, size variance of the nanoplasmonic particles 107 may be equal to or less than 15%. That is, most of the nanoplasmonic particles 107 may have a relatively uniform size within ±15% of an average size.

In order to further improve the luminescence efficiency of the emitting layer 105, the nanoplasmonic particles 107 may be disposed at small intervals in a direction taken parallel to the substrate 101. In one embodiment, for example, a distance d between adjacent nanoplasmonic particles 107 may be between 0 and about 10 nm, on average.

In order to cause the surface plasmon resonance, the nanoplasmonic particles 107 may include a metal material. In one embodiment, for example, the nanoplasmonic particles 107 include a material selected from the group consisting of Ag, Au, Cu, Pb, In, Hg, Sn, Cd, and combinations thereof. Although not illustrated in FIG. 1, in order to improve light extraction efficiency of the light-emitting device 100, the nanoplasmonic particles 107 may be arrayed according to a lattice-structure pattern in the plan view (e.g., a mesh-structure pattern).

The second electrode 108 may be a cathode, and may include a conductive material having a relatively low work function so as to ease the injection of electrons into the ETL 106. Also, the second electrode 108 may function as a reflective electrode reflecting light so as to allow light, which is generated in the emitting layer 105, to be emitted via the substrate 101. The second electrode 108 may include an aluminium material. In addition to the aluminium material, the second electrode 108 may include a metal selected from the group consisting of magnesium, calcium, sodium, kalium, titanium, indium, yttrium, lithium, gadolinium, aluminium, silver, tin, lead, caesium, barium, alloys thereof and combinations thereof, or may have a multi-structure including LiF/Al, $LiO_2$/Al, LiF/Ca, LiF/Al, and $BaF_2$/Ca.

Hereinafter, operations of the light-emitting device 100 having the aforementioned structure will now be described. First, a voltage is applied to the first electrode 102 and the second electrode 108. Holes that are generated in the first electrode 102 are delivered to the emitting layer 105 via the HIL 103 and the HTL 104. Also, electrons that are generated in the second electrode 108 are delivered to the emitting layer 105 via the ETL 106. By doing so, the electrons and the holes are recombined in the QDs in the emitting layer 105, so that excitons are generated therefrom. When the excitons move to a ground state due to radiative decay, light is generated. The light is radiated in every direction, and some of the light proceeds toward the substrate 101 and then is externally emitted. Also, some of the light proceeds toward the second electrode 108, is reflected from the second electrode 108, and then is externally radiated via the substrate 101.

Some of the generated light is incident on the nanoplasmonic particles 107 in the ETL 106, and then causes the surface plasmon resonance. The surface plasmon indicates a surface electromagnetic ("EM") wave that is generated at an interface between a metal thin film and a dielectric, due to charge density oscillation of electrons, which occurs on a surface of the metal thin film when light having a particular wavelength is incident on the metal thin film. The surface electromagnetic wave, which is generated via the surface plasmon resonance, is an evanescent wave having strong intensity but a short effective distance.

A wavelength of light that causes the surface plasmon resonance may vary according to materials of the metal thin film. In one embodiment, for example, silver (Ag) may cause the surface plasmon resonance in relatively short blue and green wavelength bands, and gold (Au) may cause the surface plasmon resonance in a relatively long green wavelength band. Also, the wavelength of light that causes the surface plasmon resonance may also be affected by a refractive index of the dielectric, and a size and shape of the metal thin film.

Figure 2:
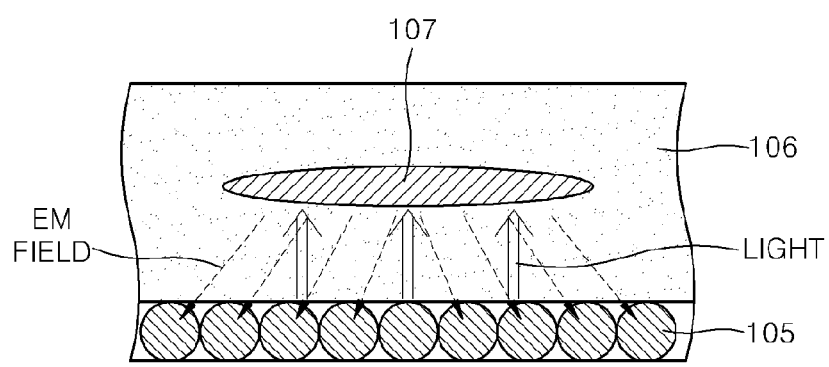
FIG. 2 is a diagram for describing an operation of the light-emitting device of FIG. 1.

Referring to FIG. 2, an intensive electromagnetic wave generated in the nanoplasmonic particles 107 by the surface plasmon resonance is indicated by using a dotted line. As illustrated in FIG. 2, the electromagnetic wave may reach the QDs in the emitting layer 105. Afterward, the QDs in the emitting layer 105 are excited by the electromagnetic wave, and then additionally emit light. Thus, according to the present embodiment, not only electroluminescence ("EL") due to recombination of the electrons and the holes, but also photoluminescence ("PL") due to the intensive incident electromagnetic wave occur in the QDs in the emitting layer 105. As a result, intensity of light generated in the emitting layer 105 may be increased so that the efficiency and brightness of the light-emitting device 100 may be further improved. Also, the nanoplasmonic particles 107 in the ETL 106 include a conductive metal capable of further accelerating the delivery of the electrons, so that an electron delivery efficiency of the ETL 106 may be further increased. Thus, by delivering more electrons to the emitting layer 105, the luminescence efficiency of the emitting layer 105 may be further improved.

Figure 3:
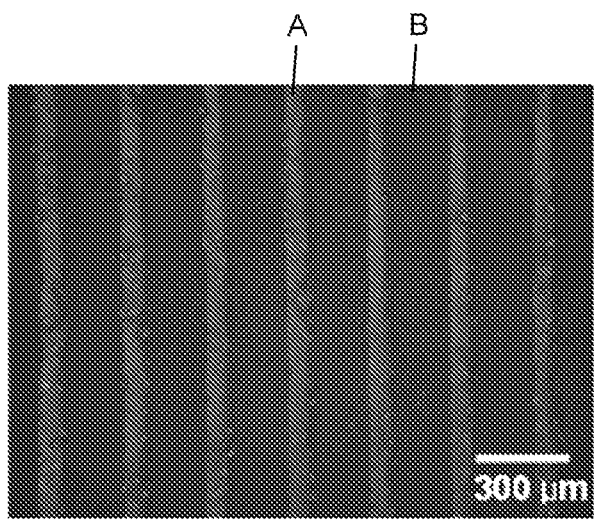
FIG. 3 is an image captured via a fluorescence microscope so as to show a luminescence efficiency of the light-emitting device of FIG. 1.

FIG. 3 is an image captured via a fluorescence microscope so as to show a luminescence efficiency of the light-emitting device 100. In order to comparatively show that the luminescence efficiency is improved by the nanoplasmonic particles 107, the nanoplasmonic particles 107 in the ETL 106 are arranged in the form of stripes at regular intervals. In FIG. 3, an area A indicates a portion where the nanoplasmonic particles 107 are formed, and an area B indicates a portion where the nanoplasmonic particles 107 are not formed. As shown in FIG. 3, it is apparent that the lighter area A with the nanoplasmonic particles 107, is brighter than the area B without the nanoplasmonic particles 107.

As described above, since the surface electromagnetic wave that is generated via the surface plasmon resonance has the short effective distance, if a distance L (FIG. 1) between the nanoplasmonic particles 107 and the emitting layer 105 is excessively large, the PL is hardly generated. In contrast, if the distance L between the nanoplasmonic particles 107 and the emitting layer 105 is excessively small, the EL is reduced or effectively prevented due to the luminescence quenching. Thus, it is necessary to appropriately select the distance L between the nanoplasmonic particles 107 and the emitting layer 105, within an effective distance of the surface electromagnetic wave that is generated via the surface plasmon resonance.

Figure 4:
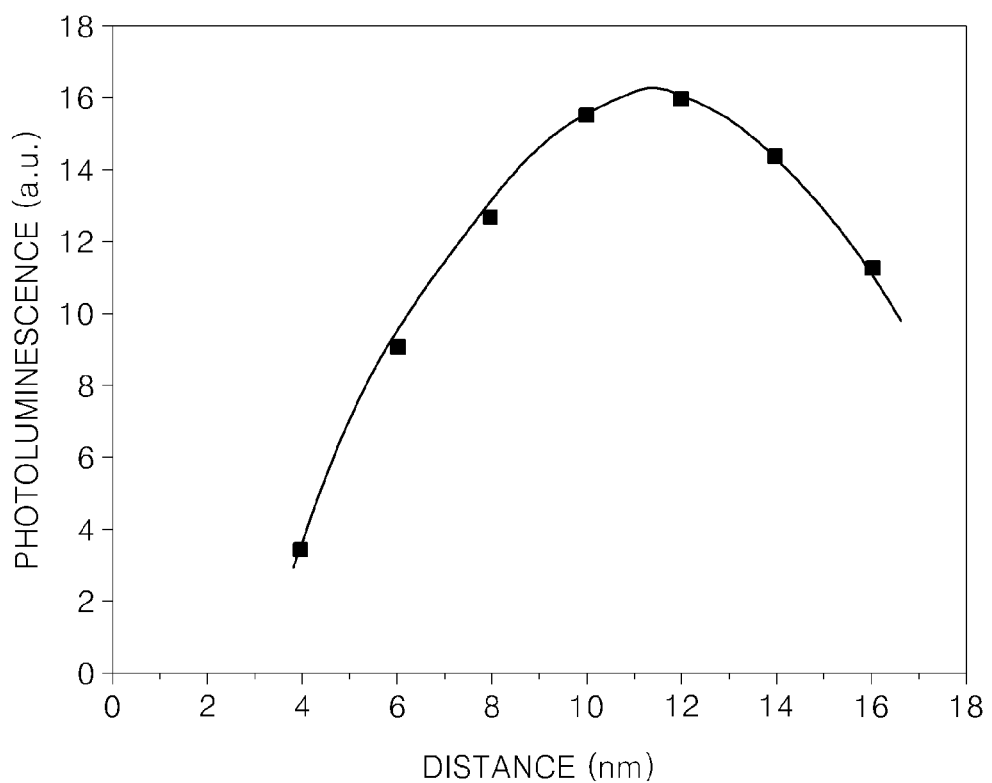
FIG. 4 is a graph for showing variation of light intensity with respect to a distance in nanometers, between nanoplasmonic particles and an emitting layer.

FIG. 4 is a graph for showing variation of light intensity with respect to the distance L between the nanoplasmonic particles 107 and the emitting layer 105. As shown in FIG. 4, the photoluminescence in arbitrary units (a.u.) indicating the light intensity decreases when the distance L between the nanoplasmonic particles 107 and the emitting layer 105 is excessively small or excessively large. Thus, referring to FIG. 4, the distance L between the nanoplasmonic particles 107 and the emitting layer 105 may be selected between about 10 nm and about 12 nm. Less than 10 nm may be considered as excessively small, and greater than 12 nm may be considered as excessively large.

Figure 5:
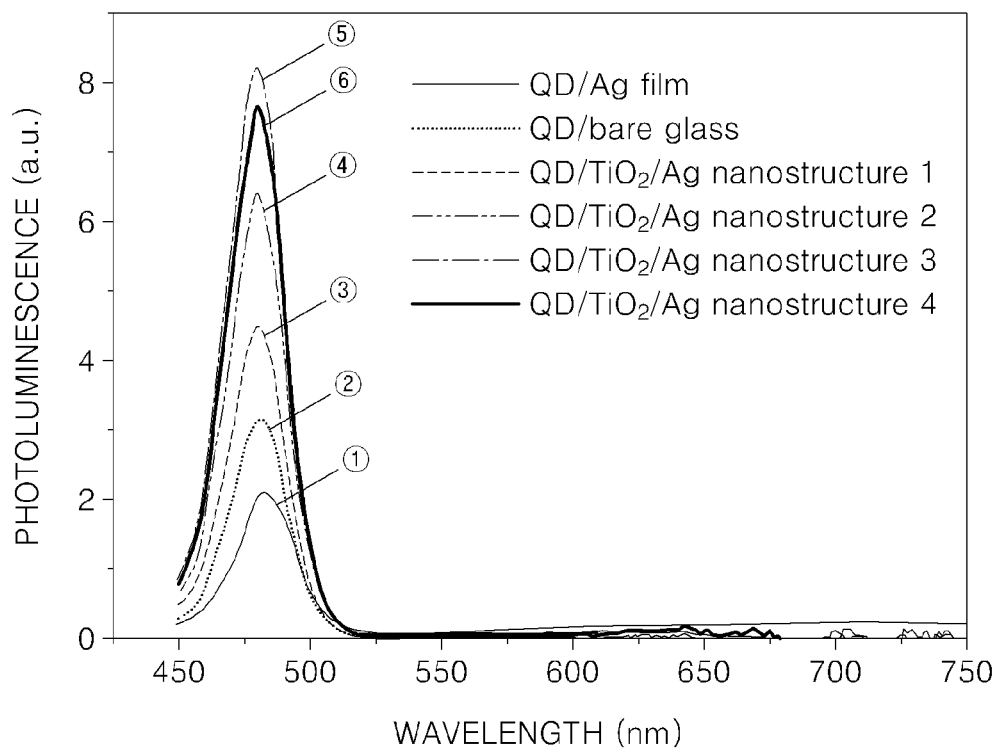
FIG. 5 illustrates graphs for showing variation of light intensity with respect to embodiments of structures of the nanoplasmonic particles.

Also, the intensity of light that is generated in the emitting layer 105 may also be affected by a structure of the nanoplasmonic particles 107 in the ETL 106. FIG. 5 illustrates graphs for showing variations of light intensity with respect to embodiments of structures of the nanoplasmonic particles 107.

In FIG. 5, a graph ① corresponds to a case in which metal (e.g., Ag) is directly arranged on QDs without the nanoplasmonic particles 107 such that luminescence quenching is caused thereby, a graph ② corresponds to a case in which metal is at a distance (e.g., not directly arranged) from the QDs without the nanoplasmonic particles 107, a graph ③ corresponds to a case in which the nanoplasmonic particles 107 are formed at a low density within the ETL 106, a graph ④ corresponds to a case in which the density of the nanoplasmonic particles 107 is increased compared to the graph ③, a graph ⑤ corresponds to a case in which the density of the nanoplasmonic particles 107 is further increased compared to the graph ④, and a graph ⑥ corresponds to a case in which the nanoplasmonic particles 107 are formed at an excessive density and thus agglomerated.

Referring to FIG. 5, the light intensity in the case of the luminescence quenching (graph ①) is small, and the light intensity in the case with the nanoplasmonic particles 107 relatively increases (graphs ③, ④ and ⑤) is greater. Also, it is possible to see that as the density of the nanoplasmonic particles 107 increases, the light intensity also increases, but the light intensity decreases when the nanoplasmonic particles 107 are formed at the excessive density (graph ⑥) and thus agglomerated. Thus, as described above, the distance d between each of the nanoplasmonic particles 107 may be between about 0 and about 10 nm on average.

Figure 6:
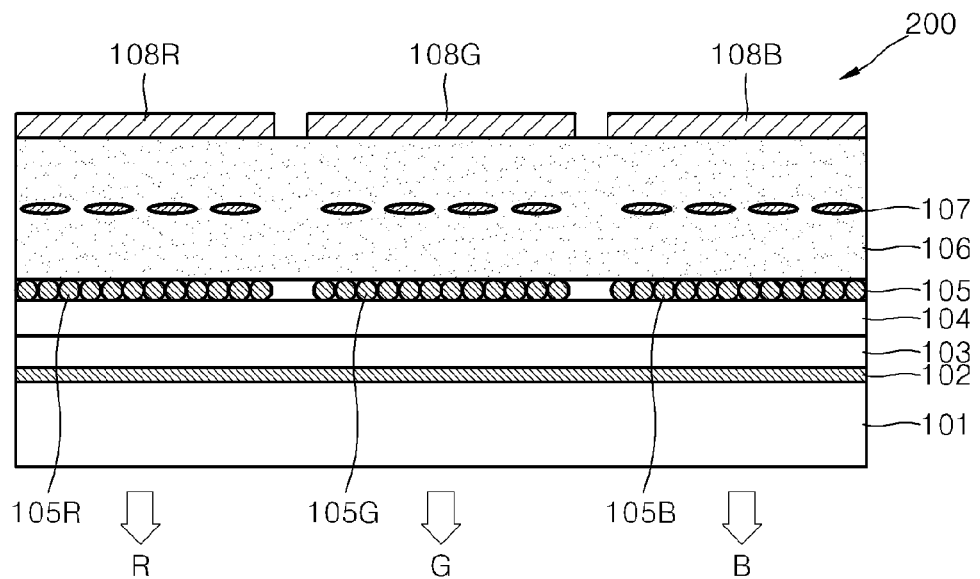
FIG. 6 is a cross-sectional view of an embodiment of a color display device, according to the present invention.

The light-emitting device 100 may be used as a color display device in such a manner that the QDs in the emitting layer 105, the nanoplasmonic particles 107 in the ETL 106, and the second electrode 108 are appropriately patterned. FIG. 6 is a cross-sectional view of an embodiment of a color display device 200 according to the present invention.

Referring to FIG. 6, a basic cross-sectional structure of the color display device 200 is the same as that of the light-emitting device 100 of FIG. 1. However, an emitting layer 105 is patterned according to red QDs 105R, green QDs 105G, and blue QDs 105B. Similarly, a plurality of nanoplasmonic particles 107 and second electrodes 108R, 180G and 180B may be patterned according to red, green, and blue pixels of the display device 200, respectively. Although not illustrated in FIG. 6, the nanoplasmonic particles 107 within each of the red, green, and blue pixels may be arrayed according to a lattice-structure pattern, such as a mesh-structure pattern, so as to improve a light extraction efficiency of the color display device 200.

In general, it is possible to adjust an emitting wavelength of a QD by adjusting a size of the QD, so that the red QDs 105R, the green QDs 105G, and the blue QDs 105B may be arrayed simply according to their sizes. Also, the nanoplasmonic particles 107 corresponding to the green QD 105G and the blue QD 105B may be silver (Ag) that causes surface plasmon resonance in blue and green wavelength bands, and the nanoplasmonic particles 107 corresponding to the red QD 105R may be gold (Au) that causes surface plasmon resonance in a red wavelength band. In this structure, by appropriately adjusting luminescence intensity of the red QDs 105R, the green QDs 105G, and the blue QDs 105B, various colors may be provided, such as red (R), green (G) and blue (B) indicated by the arrows in FIG. 6.

Hereinafter, by referring to FIGS. 7A through 7I, an embodiment of a method of fabricating the light-emitting device 100 of FIG. 1, according to the present invention will be described in detail.

Figure 7A:
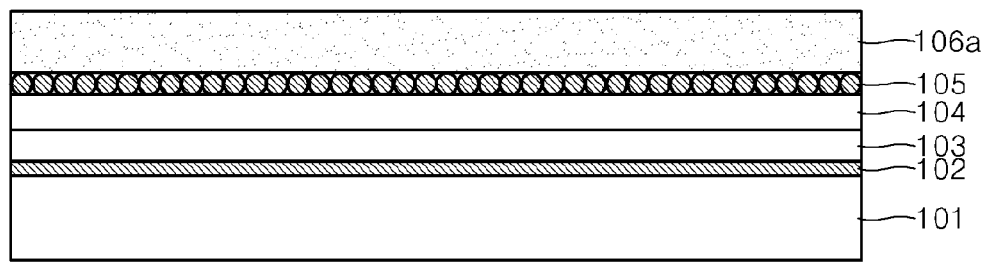
FIGS. 7A through 7I are diagrams for describing an embodiment of a method of fabricating the light-emitting device of FIG. 1, according to the present invention.

First, referring to FIG. 7A, a first electrode 102, a HIL 103, a HTL 104, an emitting layer 105, and a first ETL portion 106a are sequentially formed on a substrate 101. The first electrode 102 may be formed on the substrate 101 by using a dry deposition process including a sputtering method. Also, the HIL 103 and the HTL 104 may be formed by using a spin coating method or the like. The emitting layer 105 that is formed of QDs may be formed on the HTL 104 by using a transfer-printing method involving the use of an elastomer stamp. When a bottom surface of the elastomer stamp is patterned, as illustrated in FIG. 6, the emitting layer 105 may be patterned according to red, green, and blue pixels.

The first ETL portion 106a that is formed of TiOx or ionomer resin may be coated on the emitting layer 105, and may have a thickness between about 10 nm and about 12 nm. By doing so, a distance L between the nanoplasmonic particles 107 and the emitting layer 105 may be between about 10 nm and about 12 nm, where the nanoplasmonic particles 107 are to be subsequently formed on the first ETL portion 106a. As described above, the HIL 103 and the HTL 104 are optional, and thus may not be formed as shown in FIG. 7A.

Figure 7B:
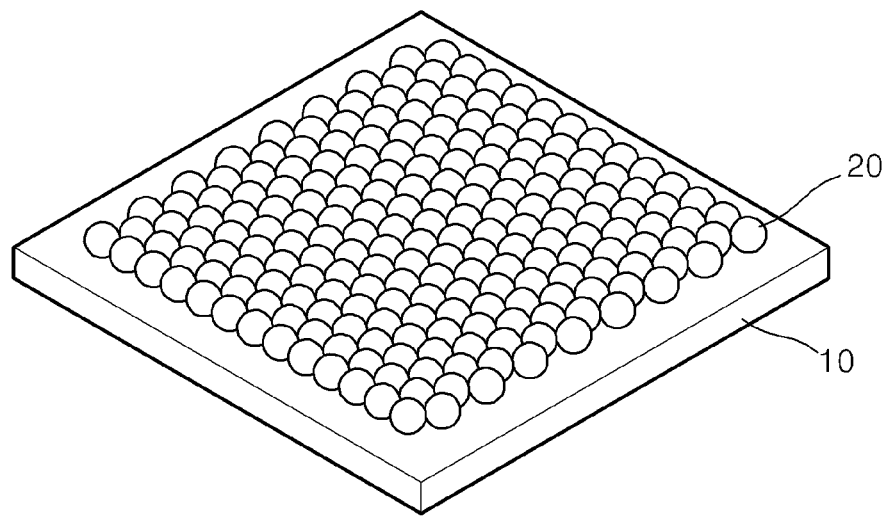

Referring to FIG. 7B, after, before, or when the procedure of FIG. 7A is performed (e.g., simultaneously), metal nanodots 20 are formed on a source substrate 10, such as by using a liquid process. The metal nanodots 20 may be formed on the source substrate 10 by using a spin coating method. In order to allow the metal nanodots 20 to be arrayed in a cluster on the source substrate 10, the metal nanodots 20 may be surface-treated by using a material including alkanethiol that forms a self-assembled monolayer ("SAM"). A diameter of each metal nanodot 20 may be between about 1 nm and about 20 nm. Also, in order to allow the metal nanodots 20 to be easily delaminated from a surface of the source substrate 10 in a process thereafter, the source substrate 10 may also be surface-treated. In one embodiment, for example, in a case where the source substrate 10 is formed of silicon, the surface of the source substrate 10 may undergo a silanization process or a fluorination process. By doing so, a surface energy of the source substrate 10 is significantly decreased so that the metal nanodots 20 may be easily delaminated from the surface of the source substrate 10.

Figure 7C:
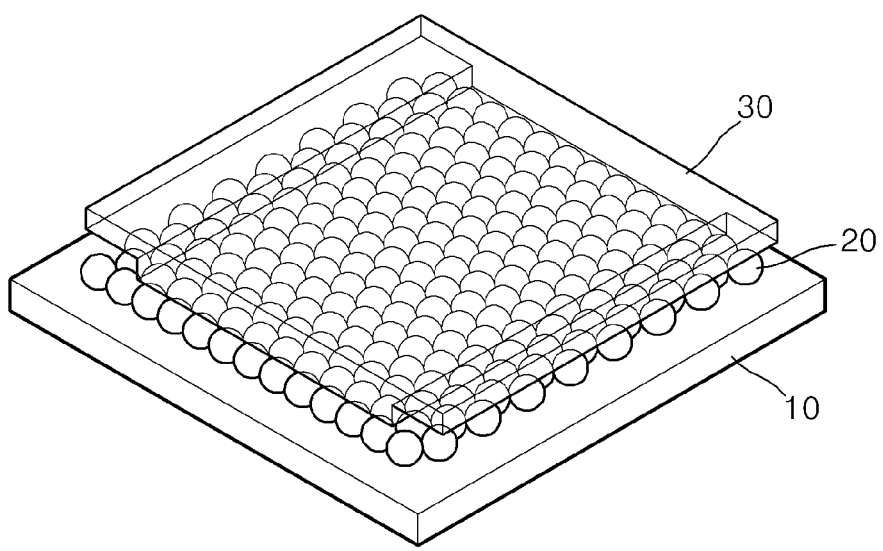

Next, referring to FIG. 7C, an elastomer stamp 30 is disposed on the metal nanodots 20 formed on the source substrate 10. In order to easily separate the metal nanodots 20 from the source substrate 10, the elastomer stamp 30 may include a material selected from the group consisting of a siloxane-based material, an acryl-based material, an epoxy-based material, and combinations thereof, or may be formed by mixing the material with other reinforcing materials. By using the elastomer stamp 30, it is possible to reduce a physical stress caused from a pressure that is applied to the metal nanodots 20 so as to separate the metal nanodots 20, and to adhere the elastomer stamp 30 closely to the metal nanodots 20, so that a separation operation may be easily performed.

Although not illustrated in FIG. 7C, a bottom surface of the elastomer stamp 30 contacting the metal nanodots 20 may be patterned. In one embodiment, for example, as illustrated in FIG. 6, when the nanoplasmonic particles 107 are patterned according to red, green, and blue pixels of the device, the bottom surface of the elastomer stamp 30 may have a pattern corresponding to the red, green, and blue pixels. Also, the bottom surface of the elastomer stamp 30 may have a lattice-structure pattern such as a mesh-structure pattern. Thus, the nanoplasmonic particles 107 to be formed on the first ETL portion 106a may be finally arrayed within the finished device according to the lattice-structure pattern.

Figure 7D:
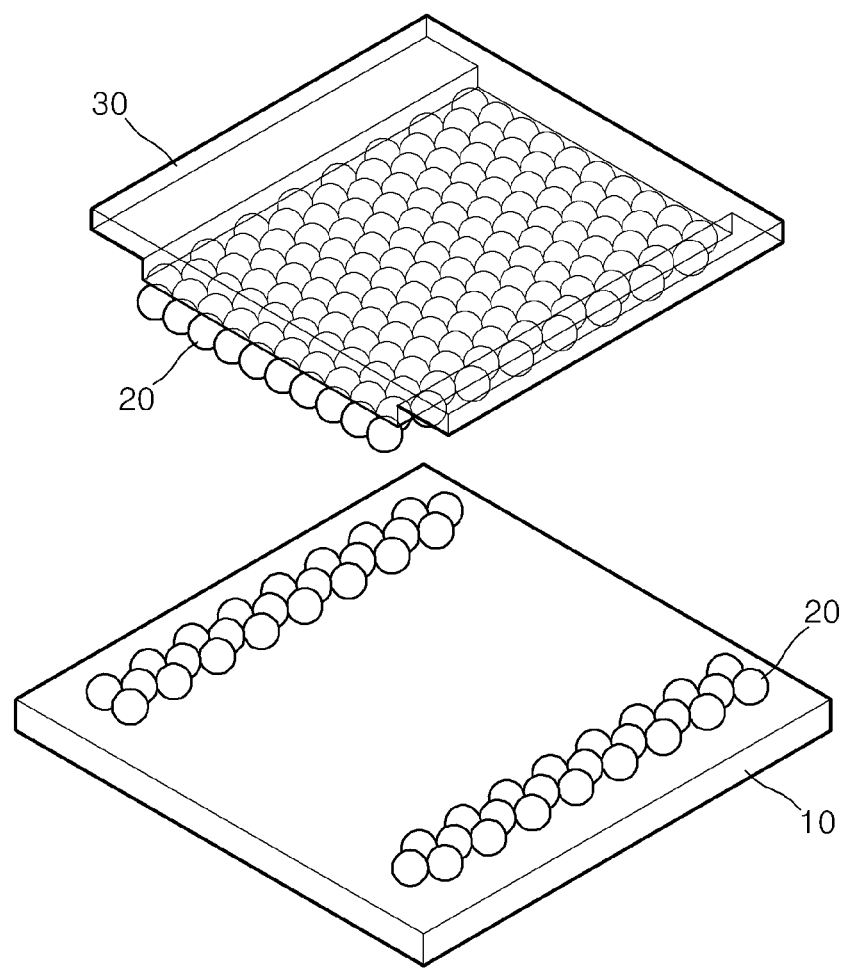
Figure 7E:
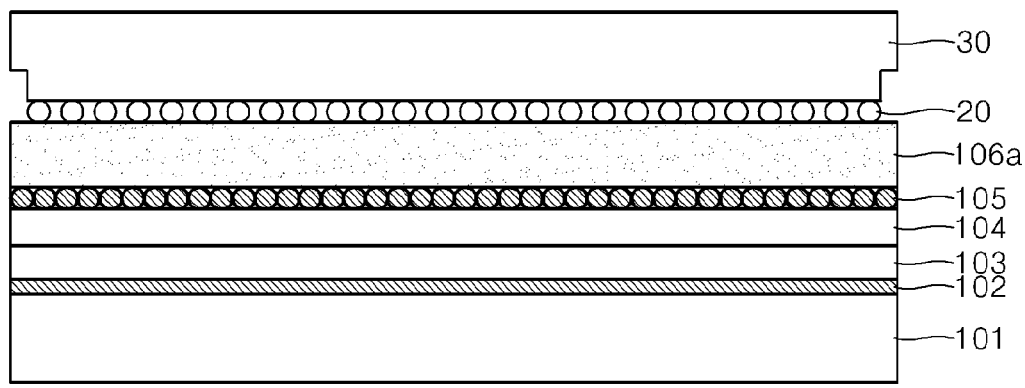

Then, as illustrated in FIG. 7D, the metal nanodots 20 are separated from the source substrate 10 by using the elastomer stamp 30. Next, as illustrated in FIG. 7E, the elastomer stamp 30 having the metal nanodots 20 attached on the bottom surface thereof are adhered to a surface of the first ETL portion 106a illustrated in FIG. 7A, and then the metal nanodots 20 are transferred onto the first ETL portion 106a, that is separated from the elastomer stamp 30. In order to allow the metal nanodots 20, which are attached on the bottom surface of the elastomer stamp 30, to be easily transferred onto the first ETL portion 106a, the elastomer stamp 30 may be slightly heated, or a minute vibration may be applied to the elastomer stamp 30 via a piezoelectrical effect or a sonic wave.

Figure 7F:
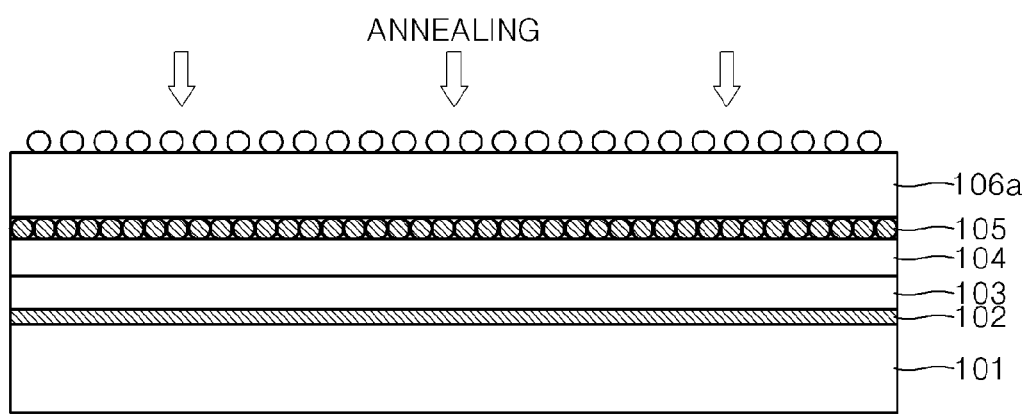
Figure 7G:
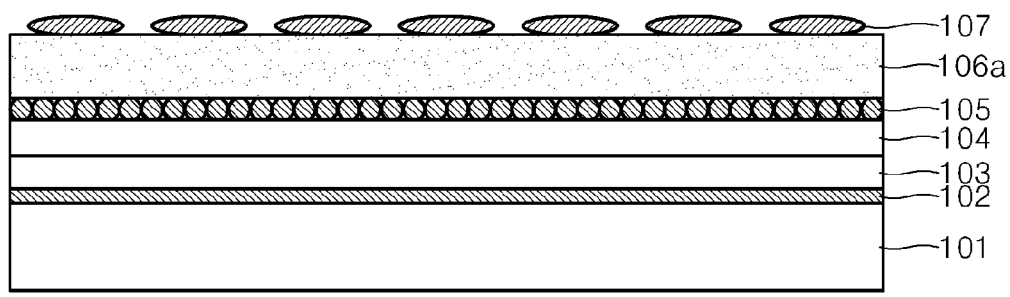

After the metal nanodots 20 are completely transferred onto the first ETL portion 106a, as illustrated in FIG. 7F, a thermal annealing operation is performed so as to form the nanoplasmonic particles 107. In one embodiment, for example, the thermal annealing operation may be performed in a nitrogen atmosphere for about 30-40 minutes at a temperature between about 150 degrees Celsius (° C.) and about 250 Celsius (° C.). Then, as illustrated in FIG. 7G, the metal nanodots 20 are partially melted and adhered to each other so that the metal nanodots 20 may be transformed into a plurality of discrete nanoplasmonic particles 107 in a thin nano-disc shape, which may cause surface plasmon resonance. Simultaneously, an organic ligand such as alkanethiol on the surface of the metal nanodots 20, may be removed by heat.

If the first ETL portion 106a is vulnerable to heat, the thermal annealing operation may be performed before the metal nanodots 20 are delaminated from the source substrate 10. In one embodiment, for example, when the metal nanodots 20 are self-assembled on the source substrate 10 as illustrated in FIG. 7B, the thermal annealing operation is performed so that the nanoplasmonic particles 107 may be directly formed on the source substrate 10. Afterward, similar to procedures of FIGS. 7C through 7E, the nanoplasmonic particles 107 on the source substrate 10 may be transferred onto the first ETL portion 106a by using the elastomer stamp 30.

Figure 7H:
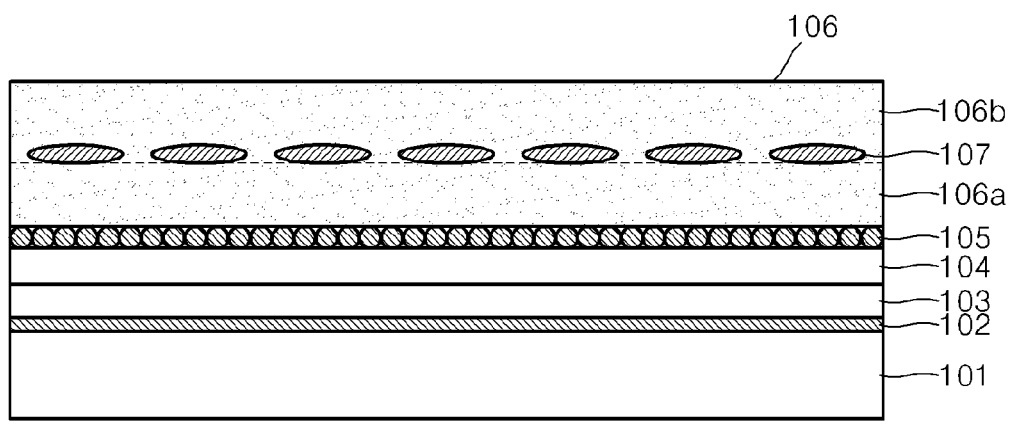
Figure 7I:
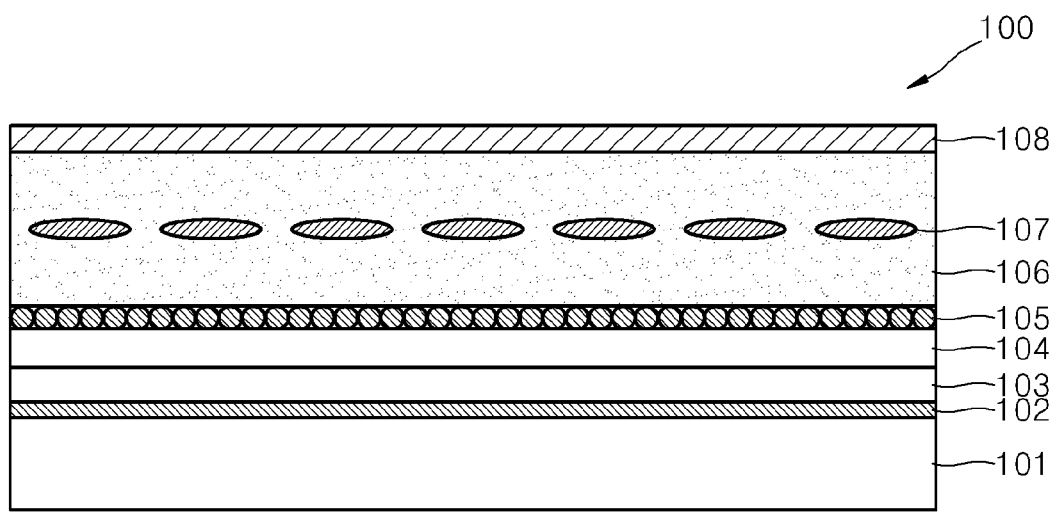

Then, as illustrated in FIG. 7H, a second ETL portion 106b is coated on the first ETL portion 106a and the nanoplasmonic particles 107. Similar to the first ETL portion 106a, the second ETL portion 106b may include TiOx or ionomer resin, and may have a thickness between about 30 nm and about 50 nm. Thus, an ETL 106 in which the nanoplasmonic particles 107 are buried at regular intervals may be complete. Afterward, referring to FIG. 7I, by forming a second electrode 108 on the ETL 106 by using a dry deposition process including a sputtering method, the light-emitting device 100 in FIG. 1 is fabricated. Although one second electrode 108 is illustrated in FIG. 7I, the second electrode 108 may also be patterned according to red, green, and blue pixels as illustrated in FIG. 6.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A light-emitting device comprising:
a substrate;
a first electrode on the substrate;
an emitting layer on the first electrode, and comprising a plurality of quantum dots;
an electron transport layer on the emitting layer;
a plurality of nanoplasmonic particles dispersed in the electron transport layer, each nanoplasmonic particle having a nano-disc shape; and
a second electrode on the electron transport layer,
wherein
the nano-disc has a thickness between about 5 nanometers and about 50 nanometers and a diameter between about 10 nanometers and about 100 nanometers, and
an average distance between nanoplasmonic particles is greater than 0 nanometer and less than 10 nanometers.

2. The light-emitting device of claim 1, further comprising:
a hole injection layer between the first electrode and the emitting layer and on the first electrode, and
a hole transport layer between the hole injection layer and the emitting layer.

3. The light-emitting device of claim 1, wherein the plurality of nanoplasmonic particles cause surface plasmon resonance due to light emitted from the emitting layer.

4. The light-emitting device of claim 3, wherein a distance between the plurality of nanoplasmonic particles and the emitting layer is within an effective distance of an electromagnetic wave which is generated by the surface plasmon resonance.

5. The light-emitting device of claim 4, wherein the distance between the plurality of nanoplasmonic particles and the emitting layer is between about 10 nanometers and about 12 nanometers.

6. The light-emitting device of claim 1, wherein a size of each of the plurality of nanoplasmonic particles is within ±15% of an average size of the plurality of nanoplasmonic particles.

7. The light-emitting device of claim 1, wherein the plurality of nanoplasmonic particles include a metal material selected from the group consisting of Ag, Au, Cu, Pb, In, Hg, Sn, Cd, and combinations thereof.

8. The light-emitting device of claim 1, wherein the electron transport layer includes an inorganic oxide semiconductor material or an organic material.

9. The light-emitting device of claim 8, wherein the electron transport layer includes titanium oxide or ionomer resin.

10. The light-emitting device of claim 8, wherein the electron transport layer has a thickness between about 40 nanometers and about 60 nanometers.

11. The light-emitting device of claim 1, wherein the substrate is a transparent substrate, the first electrode is a transparent electrode, and the second electrode is a reflective electrode.

12. The light-emitting device of claim 1, wherein the plurality of nanoplasmonic particles are arrayed according to a lattice-structure pattern.

* * * * *